(12) United States Patent
Lemanczyk et al.

(10) Patent No.: US 6,914,571 B1
(45) Date of Patent: Jul. 5, 2005

(54) DEVICE FOR MEASURING CHARACTERISTICS OF AN ELECTROMAGNETIC FIELD, PARTICULARLY FOR THE RADIATION DIAGRAM OF AN ANTENNA

(75) Inventors: Jerzy Michal Lemanczyk, Leiden (NL); Palle Frank Jensen, Lyngby (DK); Aksel B. Frandsen, Charlottenlund (DK)

(73) Assignee: Agence Spatiale Europeenne, Paris (FR)

( * ) Notice: Subject to any disclaimer, the term of this patent is extended or adjusted under 35 U.S.C. 154(b) by 353 days.

(21) Appl. No.: 09/599,438

(22) Filed: Jun. 22, 2000

(30) Foreign Application Priority Data

Jun. 23, 1999 (FR) .......................................... 99 08015

(51) Int. Cl.$^7$ ............................................. G01R 29/10
(52) U.S. Cl. .................................. 343/703; 250/515.1
(58) Field of Search ............................. 250/304, 515.1, 250/505.1, 453.1, 454.11, 455.11; 324/457, 458, 500; 455/91, 115, 106; 375/224; 340/653; 343/703

(56) References Cited

U.S. PATENT DOCUMENTS

| | | | |
|---|---|---|---|
| 4,218,683 A | * | 8/1980 | Hemming .................. 343/703 |
| 4,794,396 A | * | 12/1988 | Pothier ....................... 343/703 |
| 5,033,833 A | * | 7/1991 | Brown ........................ 350/443 |
| 5,581,267 A | * | 12/1996 | Matsui et al. ............... 343/837 |
| 5,796,094 A | * | 8/1998 | Schofield et al. ........ 250/208.1 |

FOREIGN PATENT DOCUMENTS

JP 11-074680 3/1999

* cited by examiner

Primary Examiner—John R. Lee
Assistant Examiner—David A. Vanore
(74) Attorney, Agent, or Firm—Oblon, Spivak, McClelland, Maier & Neustadt, P.C.

(57) ABSTRACT

The present invention relates to a device for measuring characteristics of an electromagnetic field emitted by a source being tested, comprising a radiating element (8), a support (6) for said radiating element and a mount (5) on which said support is fastened. It is characterized in that it comprises a screen (7) carried by said support (6) and interposed between said radiating element (8) and said mount (5), and in that said screen (7) is adapted to reflect the beams ($R_1$, $R_2$) impinging upon it so as to re-emit and scatter them into space, along determined directions ($R'_1$, $R'_2$). In the measuring device wherein said radiating element (8) is associated with the sighting axis ($\Delta$), so as to point the measuring device (4) along determined measuring directions, said screen (7) can be shaped such that said determined directions ($R'_1$, $R'_2$) include large amplitude angles with said sighting axis ($\Delta$). The measurement site can comprise an anechoid chamber (9) enclosing said source and having walls (90).

21 Claims, 4 Drawing Sheets

DEVICE FOR MEASURING CHARACTERISTICS OF AN ELECTROMAGNETIC FIELD, PARTICULARLY FOR THE RADIATION DIAGRAM OF AN ANTENNA

The present invention relates to a device for measuring the characteristics of an electromagnetic field radiated by a source, in particular the radiation diagram off an antenna emitting within the hyper-frequency range.

In order that the present invention may be better understood, and although such cannot be limited to this application only, the invention will be disclosed within the frame of its preferred application, namely measuring the radiation diagram of an antenna, more particularly an antenna used in the very high frequency range.

BACKGROUND OF THE INVENTION

The radiation characteristics of an antenna may be determined by measuring the antenna field on an imaginary surface crossed by the radiated power. This measurement surface typically is planar, cylindrical or spherical. Said measures naturally will usually be performed on the user's site.

The measuring device generally is called a measure probe. The appended FIG. 1A schematically illustrates an example of a prior art measure probe.

Such a measure probe $1a$ essentially includes the following components: a radiating element 13 carried con a support 12 and a probe mount 10. This mount 10 also can act as a support for various electronic circuits for converting and processing the signals received by the probe $1a$. The support 12 and the radiating element 13 constitute the probe proper.

The radiating element 13 can have several shapes, depending upon the precise application concerned, the frequency range to be measured, the polarization of the waves emitted by the antenna being tested, etc. Significant examples of the radiating element 13 may be of the slit or dipole type. It should be clearly understood that the word "radiating" indifferently applies to the emission or reception of waves. Finally, the support 2 of the radiating element 13 may be fastened on the mount 10 in an irremovable or a removable manner. The fastening member usually comprises a plate associated with an absorbing element $11a$, which will strongly attenuate the received radiation within the range of the frequencies to be measured.

In a well-known manner, determining characteristics of an antenna being tested, such as its radiation diagram for instance, first requires that the measure probe itself be perfectly characterized. Not only a certain number of measuring parameters, but also the probe behavior when immersed in an electromagnetic field, namely need to be known. Even a small size measure probe will not stay "neutral" with respect to the electromagnetic field to be measured. It will interact with it and potentially disturb it.

Characterizing or, in other words, calibrating a measure probe includes determining its radiation diagram, its polarization properties, its gain, and the input reflection coefficient(s) on the probe port(s).

This procedure usually is performed on a so-called calibration site, different from the site where a potential user will erect the measure probe. It usually is a high precision measurement site, where all measuring parameters can be mastered. All the measure probe characteristics are then perfectly defined by a calibration data set.

The measure probe $1a$ can then be delivered to a potential user, with its calibration data set, for on site tests of an antenna. If however the performances of the measure probe, after its erection on site, are different from the performance previously determined during calibration, the reliability of the measured data of the antenna being tested is questionable.

The FIG. 1B schematically illustrates the characteristics measurement procedure for an antenna 2 on the testing site. The antenna 2 being tested is fixed and emits a radiation with certain determined characteristics, to be measured. The measure probe $1a$, on the other hand, is movable in space, on a predetermined surface (a plane for instance), as previously indicated. For this purpose, the measure probe $1a$ is mounted on the movable carrying device 3, which is moved along a determined path for scanning the above mentioned surface, advantageously under control of computerized means. The measures performed at each point are recorded and real time processed.

A major drift source between performances respectively obtained on the calibration site and the measurement site may be found in the differences in the erection of the measure probe $1a$ at both sites. A solution consequently needs to be found, i.e. in practice, arranging an appropriate means that will allow eliminating the harmful influence of the erection of the measure probe $1a$.

Eliminating for its major part the influence of the mounting assembly of the probe $1a$ is relatively simple on the calibration site (FIG. 1A), just by an appropriate digital processing of the calibration data. As previously indicated, the calibration site characteristics namely are perfectly known, repetitive and mastered. The calibration source characteristics also are well known.

The environmental characteristics however are different for each measurement site (FIG. 1B). The exact characteristics of the radiation source, i.e. the antenna 2 being tested, by definition are unknown since they precisely are the objects of the measurement. Mainly the carrying device supporting the probe is there normally different from its supporting assembly on the calibration site.

Using the calibration data set as it stands consequently is impossible if high precision measurements are required.

Various prior art solutions were proposed as attempts for solving this problem. The FIGS. 2A and 2B illustrate one of those proposed solutions. Elements that are common with those of the previous figures are designated by the same references and will only be described again as needed.

This solution was described in the following documents, which can be advantageously referred to for additional details:

the article "Accurate gain measurement on small aperture antennas", Franck JENSEN and J. LEMANCZYK, "Proceedings of 14th ESA Workshop on Antenna Measurements", WWP-028, May 6–8 1991, and the article "The calibration probes for near-field measurements", Franck JENSEN and J. LEMANCZYK, "AMTA Symposium", pp. 9.5–9.10, Oct. 7–11 1991.

As compared with the measure probe $1a$ of FIGS. 1A and 1B, the present measure probe, now called $1b$ shows a different structure, essentially because an absorbing element $11b$ now is an integral part of the measure probe proper. As FIG. 2A more particularly illustrates, the absorbing element $11b$ is directly fastened to the support 12, behind the radiating element 13.

As illustrated in FIG. 2B, an additional fixed absorbent element 14, with a slit 140 that allows the measure probe $101b$ to be moved on the movable carrying device 3, is provided on the measurement site.

This solution however suffers from a certain number of inconveniences. The absorbing elements namely are made of lightweight and brittle materials. Both a good reproducibility and a stable shape, from the point or view of the electrical properties, consequently are difficult to guarantee.

It is the object of the present invention to overcome the deficiencies of the prior art devices, some of which were just described.

SUMMARY OF THE INVENTION

For this purpose, the invention according to a major feature provides means for re-emitting the radiation in a controlled way, instead of an absorbing element for the energy radiated towards the measure probe mount.

This is obtained by using a screen, based on a material that will reflect and re-emit the incident energy, within the range of the wavelength to be measured.

According to another feature of the invention, said screen shape is optimized in order that the energy radiated by said screen may be redistributed along angular directions with large amplitude, for which the nuisances are unimportant.

The measurement site generally comprises an anechoic chamber wherein the antenna to be tested is located. The walls of this chamber are based on an absorbent material, for the electromagnetic waves within the antenna emission frequency range. The screen re-emission angles can be determined in such a way that the re-emitted radiation is directed towards, and absorbed by, the walls of this anechoic chamber.

The invention consequently offers a number of advantages, among which:

- the measure probe mount is not illuminated anymore, since the screen protects it, and it consequently has no influence on the measure probe characteristics;
- the measure probe mount has no impact on the currents that develop on the measure probe support;
- the measure probe structure is strong and will stay stable in normal operating conditions;
- the screen can be very precisely determined to optimize performances, as concerns the diffusion within the radiation space, the geometric dimensions and the weight, while using proved and validated software;
- the currents within the measure probe support already are controlled at the design stage, for instance by adding chokes or adopting similar dispositions;
- the screen can be used for all types of the radiating elements: dipole or open, horn shaped wave-guide, etc.;
- a well-defined discrete interface exists between the measure probe proper and its mount: the dimensions of the radiating parts, such as the radiating element, its support and the screen, are well-defined, and the expansion of the probe radiation in spectral mode comprises a finite number of modes;
- the screen can be designed so that the measure probe characteristics variation is small when the frequency changes, so that no very fine frequency increments are needed while performing the calibration;
- the design and the production of such a measure probe is entirely compatible with the technologies of this field and do not increase the complexity nor imply any significant cost increase.

The main object of the invention consequently is a measuring device for measuring characteristics of an electromagnetic field emitted by a source, hereafter designated as being tested, comprising a radiating element, a support for said radiating element, a probe mount on which said support is fastened, and further comprising a screen carried by said support and interposed between said radiating element and said probe mount, said screen being so designed that it is effective to reflect the beams impinging upon it and re-emit them as scattered into space, along diverging directions.

BRIEF DESCRIPTION OF THE DRAWINGS

The invention will now be described in a more detailed manner while referring to the appended drawings, in which.

DESCRIPTION OF PREFERRED EMBODIMENT

Figure 1A:
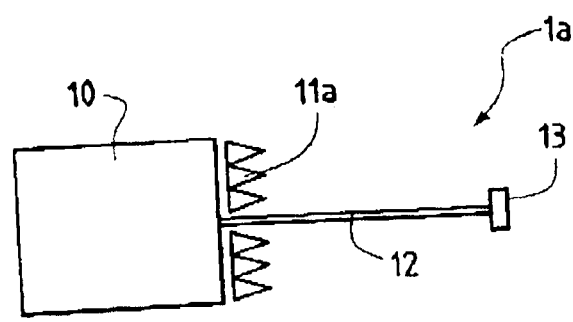
FIGS. 1A and 1B schematically illustrate a first example of a measure probe for the characteristics of an electromagnetic field, during a calibration phase and during a measuring phase proper.
Figure 1B:
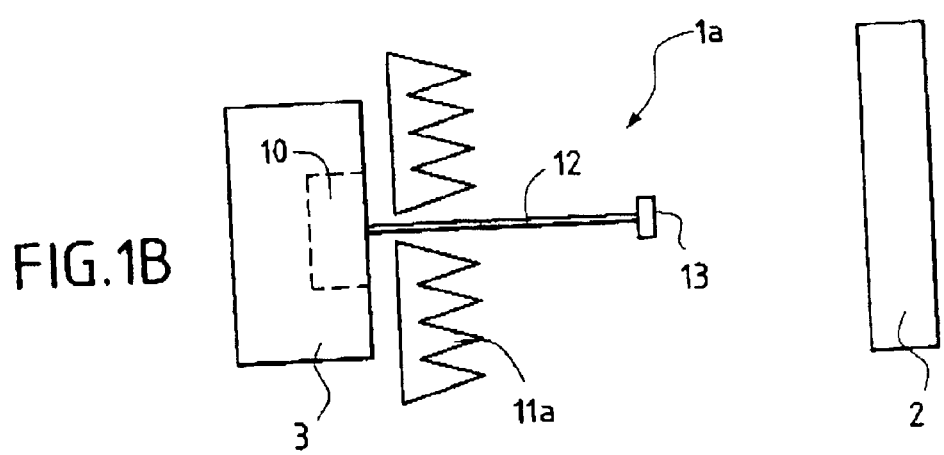
Figure 2A:
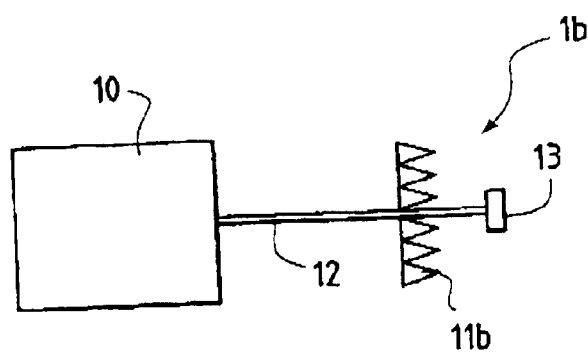
FIGS. 2A and 2B schematically illustrate a second example of a measure probe for the characteristics of an electromagnetic field, during a calibration phase and during a measuring phase proper.
Figure 2B:
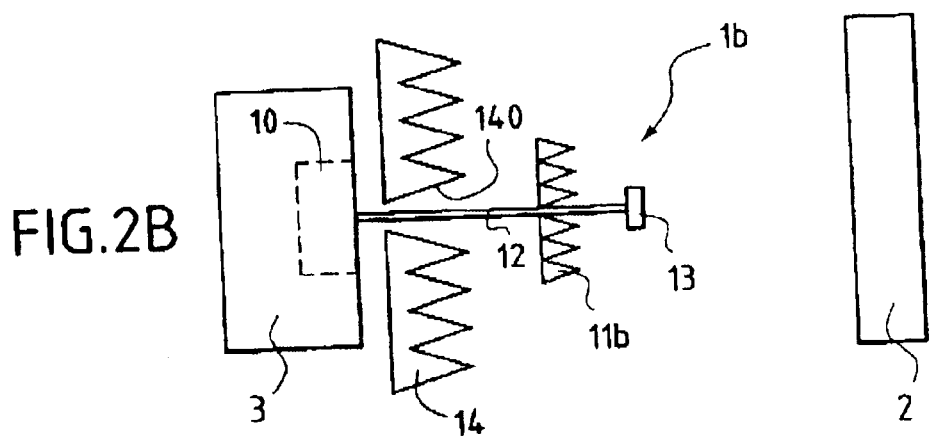
Figure 3:
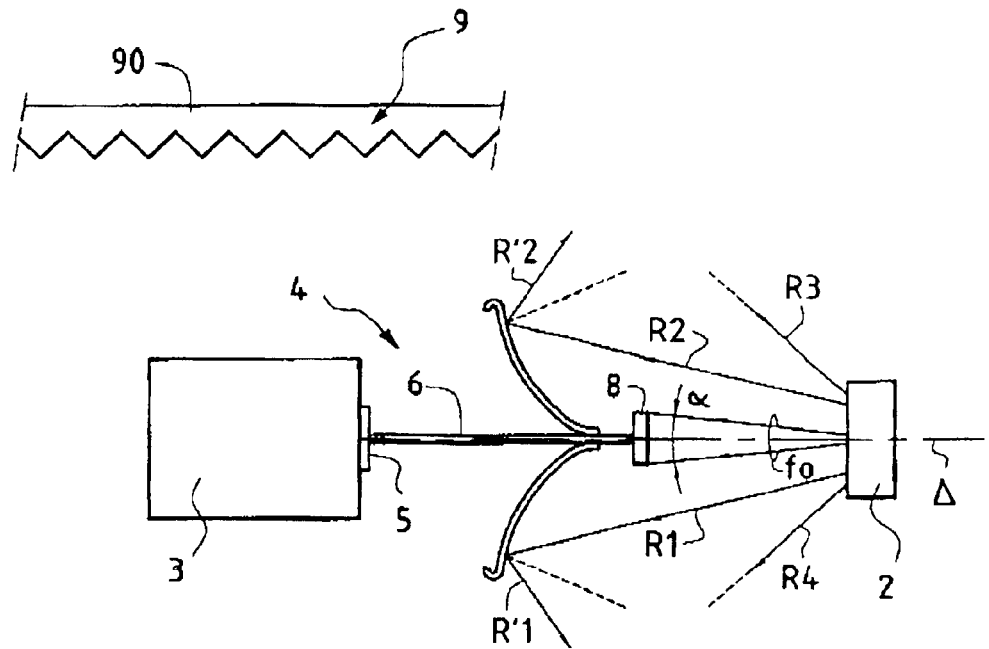
FIG. 3 schematically illustrates a measure probe structure of the invention.

The FIG. 3 schematically illustrates an embodiment of a measure probe of the invention, hereafter designated as 4.

This probe, like in the prior art, includes a radiating element a carried by a support 6 (of an elongate shape in the described example), which itself is irremovably or removably fastened to a mount 5.

If the measure probe 4 is on the measurement site, it is arranged on a movable carrying device 3 and receives the electromagnetic radiation emitted by the antenna 2 being tested.

As previously indicated, all of those components generally are arranged within an anechoic chamber 9, with walls (partly represented in FIG. 3) based upon a material substantially absorbent for the waves emitted by the antenna 2.

According to the main feature of the invention, the support 6 is provided with a screen 7. This screen 7 is made of a material reflecting the captured radiation and shaped to re-emit the radiation along angular directions in such a way that the re-emitted beams will not, for their major part, hit the antenna 2 to but will be directed towards the absorbing walls 90 of the anechoic chamber 9, where they will be absorbed.

A second function of the screen 7 is to "protect" the support 6, the mount 5 and the movable carrying device 3 against the radiation emitted by the antenna 2, i.e. to exert a screen function properly.

The FIG. 3 schematically illustrates the operating mode of the invention. Only a thin central beam $f_0$, centered on the symmetry axis or central axis Δ of the measure probe 4 is captured by the radiating element 8 of the measure probe 4. In addition to the central beam $f_0$, the antenna 2 also emits beams $R_1$, $R_2$ that are angularly located on both sides of the sighting axis Δ but do not diverge enough not to be intercepted by the surface of the screen 7. They are reflected and re-emitted by this screen as diverging beams $R'_1$, $R'_2$ towards the wall 90 of the anechoic chamber 9. The extreme rays of the beam emitted by the antenna 2, for instance the rays $R_3$ and $R_4$ in the figure, directed far away from the sighting axis Δ will not be captured by the radiating element 8 nor by the screen 7, so that they will directly hit the walls 90 of the anechoic chamber 9.

Figure 4:
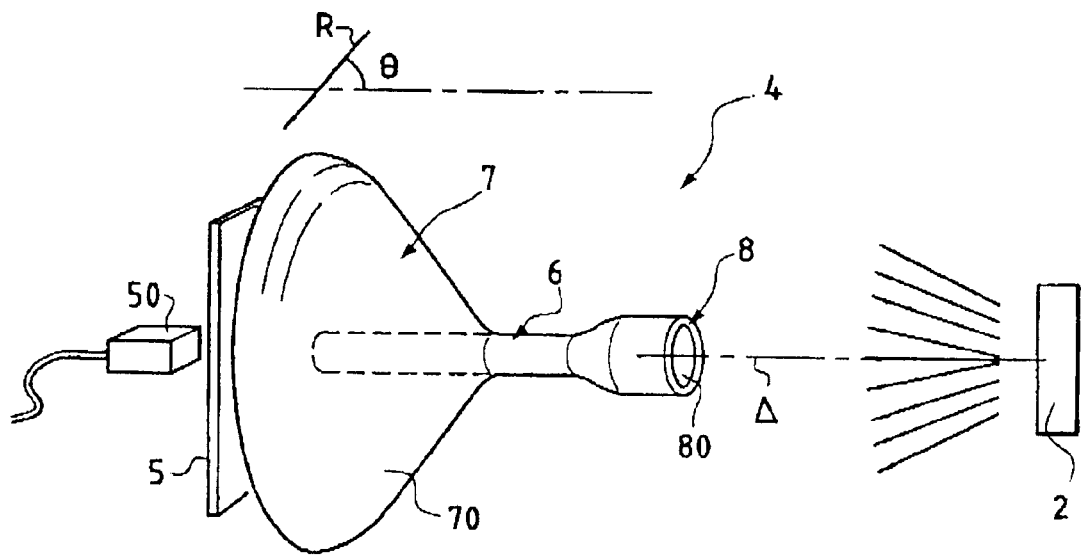
FIG. 4 illustrates a practical embodiment of a measure probe of the invention.

A practical embodiment of the measure probe 4 of the invention will now be described. The FIG. 4 represents a perspective view of such an embodiment. The elements that are common with elements of the previous figures are designated by the same references and will only be described again as needed.

In the described example, the radiating element 8 is an open conic horn receiving the electromagnetic radiation from the antenna 2 along a direction centered on the sighting axis Δ. The support 6 is a wave-guide with a circular cross section around a symmetry axis along the axis Δ. The screen 7 is shaped as a conic metallic skirt, with a circular cross section, concentric with the axis Δ. The cone vortex angle is an acute angle facing the mount 5.

The mount 5 essentially consists of a rectangular metallic plate, for instance specially processed steel, upon which the support 6 is plugged. The plane of this plate 5 is substantially orthogonal to the axis Δ. On its rear part, the plate also supports electronic circuits 5a which are responsive to the waves transmitted by the wave guide support 6 and act as an interface with a conventional (non-represented) signal processing circuit. A (non-represented) communication orifice is provided between the output of the wave-guide 6 and the electronic circuit 50.

Due to the encompassing shape of the screen 7, it is clearly ascertainable that only a radiation R with a high incident angle θ with respect to the axis Δ can reach the end of the support 6 (on the side of the mount 5) and/or the mount 5. As previously illustrated in FIG. 3, the other rays either are captured by the opening 80 of the horn 8, or hit the external surface 70 of the skirt constituting the screen 7 and are re-emitted along directions forming a substantial angle with the axis Δ. They are thereby scattered along directions diverging away from the central sighting axis.

In order that the present invention may be better understood, the main dimensions of the measuring device 4 illustrated in FIG. 4 can be indicated as follows:

diameter of the skirt constituting screen 7 (opening facing them antenna): 268 mm, opening angle of the skirt (towards the rear) with respect to axis Δ: 45 degrees, skirt wall thickness: 40 mm, cumulative length of support 6 (ahead of the skirt) and the horn 8: 216.8 mm, total length of support 6: 555 mm, length of horn 8: 171.81 mm with a 15.6 mm front flat, outside and inside diameters of horn 8: 49.0 mm and 46.6 mm, opening angle of the horn: 14.0 degrees with respect of the axis Δ, outside and inside diameters of the wave-guide: 20.9 mm and 10.9 mm, In order to more completely illustrate the advantageous features of the invention, a digital analysis of the behavior of the measure probe 4 of the invention was performed while illuminating it with a variably incident radiation, in three configurations: namely with the screen 7, without the screen 7, and without the screen 7 and the rear plate (mount).

For this purpose, the measure probe 4 was fixed and illuminated with a remote field standard source and the amplitude of the measured signal was recorded as a function of the ray incidence angle with respect to the axis Δ. The standard source frequency was 27.75 GHz.

Figure 5A:
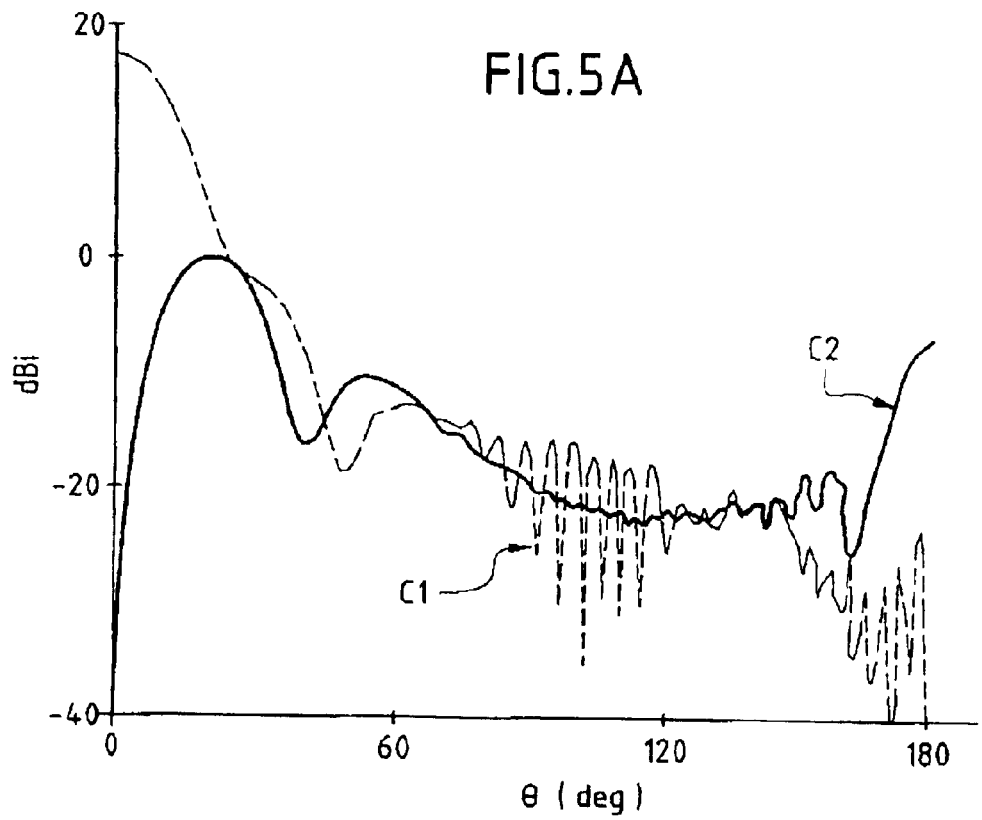
FIG. 5A is a graph showing the amplitude variation of a measured signal, depending upon the incident angle of an electromagnetic wave emitted by a source.

FIG. 5A is a graph representing the amplitude variation (in dBi) of the measured signal when the incidence angle θ varies from 0 to 180 degrees, with the screen 7, and without the screen 7 and the rear plate 5, respectively. The graph of FIG. 5A more precisely represents two sets of curves which are the radiation diagrams corresponding to co-polarization and cross-polarization at 45 degrees; $C_1$ for a measure probe 4 of the invention, with a screen 7 (and a rear plate 5) and $C_2$ with both of these components being withdrawn.

A study of these curves allows ascertaining that the presence of the screen 7 only slightly disturbs the radiation diagram of the measure probe 4 for the values of the angle θ approximately in the range between 80 and 120 degrees. When the angle θ increases, the screen impact is more pronounced.

This conforms with the object of the invention, namely redirecting the energy towards areas located outside the viewing field (as seen from the measure probe) of the antenna being tested.

Figure 5B:
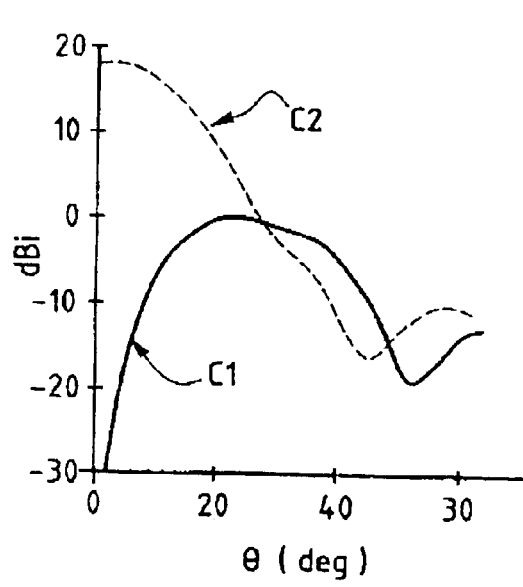
FIGS. 5B and 5C are enlarged portions of the graph of FIG. 5A.
Figure 5C:
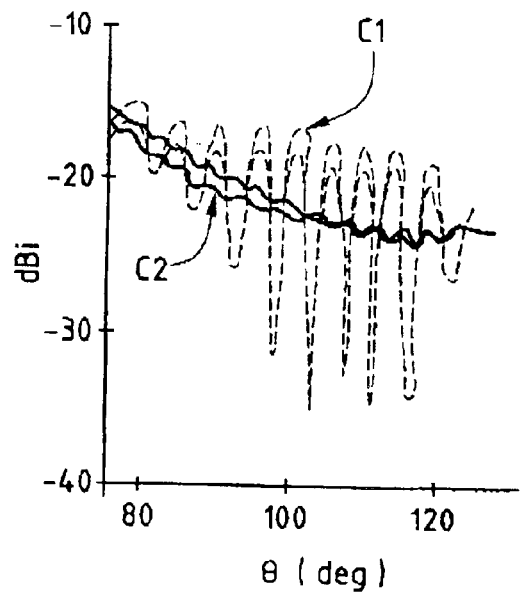

FIGS. 5B and 5C are enlarged portions of the FIG. 5A, wherein the angle θ ranges between 0 and 60 degrees and between 75 and 125 degrees, respectively.

Figure 6A:
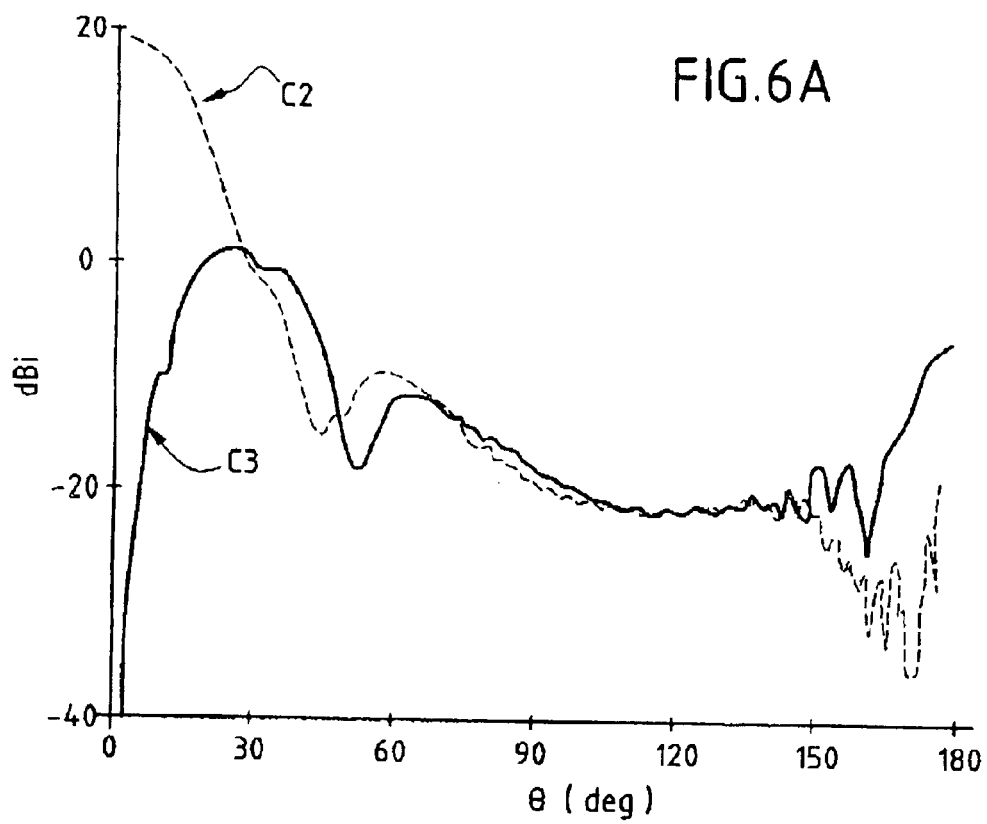
FIG. 6A is a graph showing the degradations in the probe radiation graph, caused by a withdrawal of the screen, a main characteristic component of the invention.

The set of curves $C_3$ of the FIG. 6A shows the radiation diagram degradations caused by a withdrawal of the screen 7 and a direct illumination of the mount 5. For comparison purposes, the set of curves $C_2$ (without screen 7 and rear plate 5) also is plotted on this diagram. When the incident angle is small, the radiation influence is very strong, even on the shape of the main beam showing co-polarization.

Figure 6B:
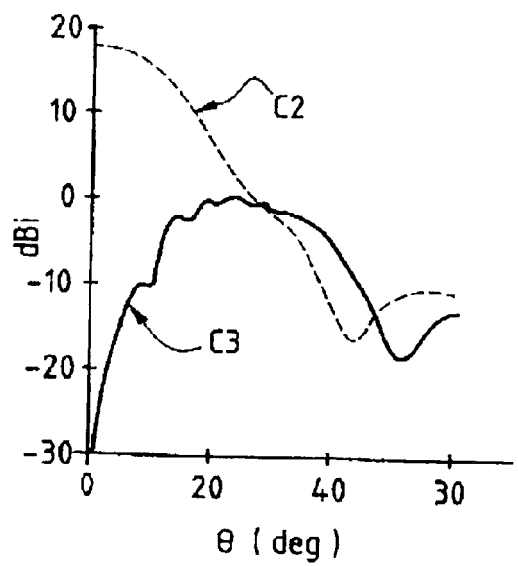
FIG. 6B is a enlarged portion of the graph of FIG. 5A.

The FIG. 6B is an enlarged portion of FIG. 6A wherein the angle θ ranges between 0 and 60 degrees.

Figure 7:
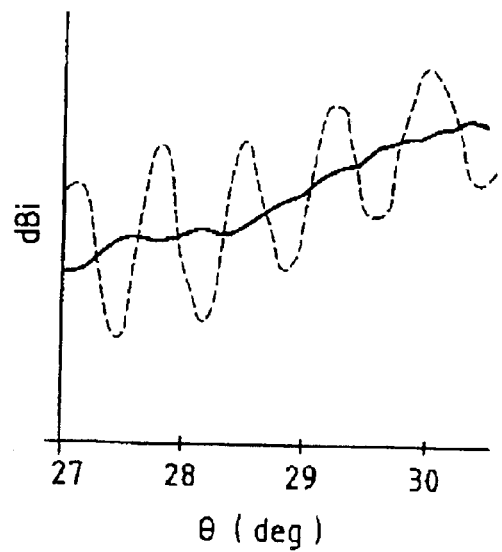
FIG. 7 is a graph illustrating the directivity of the measure probe, depending upon the frequency, with and without a screen.

The FIG. 7 is a graph illustrating the directivity variation of the measure probe 4 as a function of the frequency of the captured radiation, for two different configurations: with the screen 7 (curve $C_4$) and without the screen 7 but with the rear plate 5 (curve $C_5$). The scanning frequency range lextends from 26 to 31 GHz. The directivity is expressed in dBi.

Strong oscillations are ascertained when only the rear plate 5 is present (curve $C_5$). Those oscillations are strongly attenuated when the screen 7 is present. This results in much smoother frequency variations, one of the advantages of the invention. As previously indicated, calibrating the measure probe 4 according to the present invention does not require any fine frequency increments.

Upon reading the above, it easily can be ascertained that the invention does reach its object.

It namely offers many advantages. While avoiding repeating all of those advantages Previously stated in the introduction of the present description, let us mention the facts that the mount of the measure probe does not any longer influence the probe characteristics, due to the very arrangements of the invention, in particular because the measure probe no longer is illuminated. Those characteristics do not any longer depend upon the precise probe erection mode on the measurement site. The measure probe structure is strong and its operation will stay stable in normal operating conditions. Its structure and components are compatible with the conventionally used technologies for this type of application. The specific arrangements of the invention do not lead to any substantial cost increase, nor do they induce a larger complexity. They also allow simplifying the calibration procedures by decreasing the number of measure points required dependant upon the frequency.

It should however be clear that the invention is not in any way limited to the only embodiments that were explicitly described, in particular in relation with FIGS. 3 to 7. In particular, all numeric values only were given for a better understanding of the invention. They in fact essentially depend upon the precise application concerned, notably upon the frequency of the antenna to be tested. The same is true about the materials used.

What is claimed is:

1. A probe device for measuring a radiation pattern of an electromagnetic field radiated by an antenna under test, comprising:
   a probe mount on which a support is fastened; and
   a wave reception element and a reflective screen mounted on said support, said wave reception element being located between said antenna and said reflective screen,
   wherein waves emitted by said antenna under test are reflected away from said probe mount by said reflective screen such that said waves do not impinge upon said probe mount,
   wherein said screen is so shaped that when said antenna under test is disposed on a measurement site comprising an anechoic chamber enclosing said antenna and said probe device within walls made of a material absorbing wave lengths associated with the electromagnetic radiations from said antenna and said probe device is used as a measuring probe device for determining the characteristics of said antenna under test, said waves reflected by said screen are directed towards said absorbing walls.

2. A probe device for measuring a radiation pattern of an electromagnetic field radiated by an antenna under test, comprising:
   a probe mount on which a support is fastened;
   a wave reception element and a reflective screen mounted on said support, said wave reception element being located between said antenna and said reflective screen; and
   a movable carrying device configured to support and move the probe device to scan a predetermined surface when the probe device is used as a measuring probe device for determining the characteristics of said antenna under test and the latter is fixed,
   wherein waves emitted by said antenna under test are reflected away from said probe mount by said reflective screen such that said waves do not impinge upon said probe mount.

3. A probe device as claimed in claim 2, wherein said predetermined surface is planar.

4. A probe device as claimed in claim 2, wherein said predetermined surface is cylindrical.

5. A probe device for measuring a radiation pattern of an electromagnetic field radiated by an antenna under test, comprising:
   a probe mount on which a support is fastened; and
   a wave reception element and a reflective screen mounted on said support, said wave reception element being located between said antenna and said reflective screen,
   wherein waves emitted by said antenna under test are reflected away from said probe mount by said reflective screen such that said waves do not impinge upon said probe mount,
   wherein said screen is shaped and arranged around a central axis of symmetry to be effective to direct said reflected waves away from said central axis, said wave reception element is a conical horn, said support is a wave guide with a circular cross section arranged as an extension of said conical horn with a same central axis of symmetry, and said mount is a rectangular plate transverse to said central axis.

6. A probe device as claimed in claim 5, wherein said screen is a conic skirt having a circular cross section around said axis, inclined by an acute angle with respect to said central axis towards said probe mount.

7. A probe device as claimed in claim 6, wherein said acute angle equals 45 degrees.

8. A probe device as claimed in claim 5, wherein said wave reception element, said support, said probe mount, and said screen are made of a metallic material.

9. A probe device for measuring a radiation pattern of an electromagnetic field radiated by an antenna under test, comprising:
   a probe mount on which a support is fastened; and
   a wave reception element and a reflective screen mounted on said support, said wave reception element being located between said antenna and said reflective screen,
   wherein waves emitted by said antenna under test are reflected away from said probe mount by said reflective screen such that said waves do not impinge upon said probe mount, and said probe device is used within the hyper frequency range of said antenna for measuring a radiation diagram of said antenna.

10. A probe device as claimed in claim 6, wherein said wave reception element, said support, said probe mount, and said screen are made of a metallic material.

11. A probe device as claimed in claim 5, for use within the hyper frequency range of said antenna for measuring a radiation diagram of said antenna.

12. A measuring probe configured to measure characteristics of an electromagnetic field radiated by an electromagnetic source, the probe comprising:
   a wave reception element;
   a support configured to support the wave reception element and to be mounted to a probe mount; and
   a screen interposed between the wave reception element and the probe mount,
   wherein waves emitted by said electromagnetic source are reflected away from said probe mount by said screen such that said waves do not impinge upon said probe mount,
   wherein when the probe is used in an anechoic chamber including absorbent walls configured to absorb wavelengths associated with the electromagnetic source, the screen is configured to scatter the reflected waves toward the absorbent walls.

13. A measuring probe configured to measure characteristics of an electromagnetic field radiated by an electromagnetic source, the probe comprising:
   a wave reception element;
   a support configured to support the wave reception element and to be mounted to a probe mount;
   a screen interposed between the wave reception element and the probe mount; and a moveable carrying device configured to support and move the probe when scanning a predetermined surface, wherein waves emitted by said electromagnetic source are reflected away from said probe mount by said screen such that said waves do not impinge upon said probe mount.

14. The probe according to claim 13, wherein the predetermined surface includes a planar surface.

15. The probe according to claim 13, wherein the predetermined surface includes a cylindrical surface.

16. A measuring probe configured to measure characteristics of an electromagnetic field radiated by an electromagnetic source, the probe comprising:

a wave reception element including a conical horn;

a support configured to support the wave reception element and to be mounted to a probe mount; and a screen interposed between the wave reception element and the probe mount, wherein waves emitted by said electromagnetic source are reflected away from said probe mount by said screen such that said waves do not impinge upon said probe mount, wherein the screen is configured about a central axis of symmetry along at least one predetermined measuring direction such that the screen scatters the reflected waves away from the central axis.

17. The probe according to claim 16, wherein the support includes a wave guide having a circular cross section configured as an extension of the conical horn.

18. The probe according to claim 17, wherein the probe mount includes a rectangular plate transverse to the central axis.

19. A measuring probe configured to measure characteristics of an electromagnetic field radiated by an electromagnetic source, the probe comprising:

a wave reception element;

a support configured to support the wave reception element and to be mounted to a probe mount; and a screen including a conical skirt having a circular cross section around a central axis, inclined by an acute angle relative to the central axis toward the probe mount, the screen interposed between the wave reception element and the probe mount, wherein waves emitted by said electromagnetic source are reflected away from said probe mount by said screen such that said waves do not impinge upon said probe mount.

20. The probe according to claim 19, wherein the acute angle is 45 degrees.

21. A measuring probe configured to measure characteristics of an electromagnetic field radiated be an electromagnetic source, the probe comprising:

a wave reception element;

a support configured to support the wave reception element and to be mounted to a probe mount; and a screen interposed between the wave reception element and the probe mount, wherein at least one of the wave reception element, the support, the probe mount, and the screen includes a metallic material, wherein waves emitted by said electromagnetic source are reflected away from said probe mount by said screen such that said waves do not impinge upon said probe mount.

* * * * *